United States Patent
Su et al.

(10) Patent No.: US 9,559,639 B2
(45) Date of Patent: Jan. 31, 2017

(54) PROTECTION CIRCUIT FOR POWER AMPLIFIER

(75) Inventors: Wenjun Su, San Diego, CA (US); Aristotele Hadjichristos, San Diego, CA (US); Gurkanwal S. Sahota, San Diego, CA (US); Marco Cassia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 838 days.

(21) Appl. No.: 12/715,250

(22) Filed: Mar. 1, 2010

(65) Prior Publication Data

US 2011/0043956 A1    Feb. 24, 2011

Related U.S. Application Data

(60) Provisional application No. 61/235,313, filed on Aug. 19, 2009.

(51) Int. Cl.
*H04B 1/04*    (2006.01)
*H03F 1/52*    (2006.01)
(Continued)

(52) U.S. Cl.
CPC ........ *H03F 1/52* (2013.01); *H03F 3/24* (2013.01); *H03G 3/3042* (2013.01);
(Continued)

(58) Field of Classification Search
CPC .............. H04B 2001/0408; H04B 2001/0416; H04B 2001/0425; H04B 2001/0433; H04B 2001/0441; H04B 2001/045; H03F 1/52; H03F 2200/435; H03F 2200/78; H03F 3/24; H03G 3/3042
(Continued)

(56) References Cited

U.S. PATENT DOCUMENTS 4,015,223 A    3/1977    Cheze
4,263,653 A *  4/1981    Mecklenburg ............... 702/60
(Continued)

FOREIGN PATENT DOCUMENTS

CN    1282140 A    1/2001
CN    1367952 A    9/2002
(Continued)

OTHER PUBLICATIONS

A Scuderi et al., "A VSWR-Protected Silicon Bipolar RF Power Amplifiers with Soft-Slope Power Control", IEEE JSSC, vol. 40, No. 3, Mar. 2005, pp. 611-621.
(Continued)

*Primary Examiner* — Philip Sobutka
(74) *Attorney, Agent, or Firm* — James Gutierrez

(57) ABSTRACT

Techniques for protecting a power amplifier (PA) are described. In an exemplary design, an apparatus includes (i) a PA module to amplify an input RF signal and provide an output RF signal and (ii) a protection circuit to control a transmitter gain to protect the PA module against high peak voltage. In an exemplary design, the protection circuit includes a set of comparators to quantize an analog input signal and provide digital comparator output signals used to adjust the transmitter gain. In another exemplary design, the protection circuit reduces and increases the transmitter gain with hysteresis. In yet another exemplary design, the protection circuit has faster response to rising amplitude than falling amplitude of the output RF signal. The hysteresis and/or the different rise and fall responses may allow the protection circuit to avoid toggling the transmitter gain under severe load mismatch and to handle time-varying envelope due to amplitude modulation.

27 Claims, 9 Drawing Sheets

(51) Int. Cl.
*H03F 3/24* (2006.01)
*H03G 3/30* (2006.01)

(52) U.S. Cl.
CPC .... *H03F 2200/435* (2013.01); *H03F 2200/78* (2013.01); *H04B 2001/0408* (2013.01)

(58) Field of Classification Search
USPC .... 455/126, 115.1, 117, 127.1, 127.2, 127.4; 330/127, 129; 375/297
See application file for complete search history.

(56) References Cited

U.S. PATENT DOCUMENTS

| | | | |
|---|---|---|---|
| 4,375,051 A | 2/1983 | Theall | |
| 4,493,112 A | 1/1985 | Bruene | |
| 4,559,503 A | 12/1985 | Camand et al. | |
| 4,612,669 A | 9/1986 | Nossen | |
| 5,023,688 A | 6/1991 | Ando et al. | |
| 5,208,537 A | 5/1993 | Rietsch et al. | |
| 5,300,068 A | 4/1994 | Rosar et al. | |
| 5,361,403 A | 11/1994 | Dent | |
| 5,483,680 A | 1/1996 | Talbot | |
| 5,530,923 A | 6/1996 | Heinonen et al. | |
| 5,541,554 A | 7/1996 | Stengel et al. | |
| 5,564,086 A | 10/1996 | Cygan et al. | |
| 5,673,287 A | 9/1997 | Colvis et al. | |
| 5,774,017 A | 6/1998 | Adar | |
| 5,778,308 A | 7/1998 | Sroka et al. | |
| 5,969,582 A | 10/1999 | Boesch et al. | |
| 5,973,557 A | 10/1999 | Miyaji et al. | |
| 5,978,192 A * | 11/1999 | Young et al. | 361/56 |
| 6,020,794 A | 2/2000 | Wilbur | |
| 6,166,598 A * | 12/2000 | Schlueter | 330/127 |
| 6,188,877 B1 | 2/2001 | Boesch et al. | |
| 6,215,359 B1 | 4/2001 | Peckham et al. | |
| 6,317,608 B1 | 11/2001 | Glocker | |
| 6,362,690 B1 | 3/2002 | Tichauer | |
| 6,370,364 B1 * | 4/2002 | Liimatainen | 455/126 |
| 6,389,269 B1 | 5/2002 | Nanni et al. | |
| 6,414,562 B1 | 7/2002 | Bouisse et al. | |
| 6,441,768 B2 * | 8/2002 | Cho et al. | 341/160 |
| 6,486,808 B1 * | 11/2002 | Seppi | H03M 1/129 330/302 |
| 6,570,462 B2 | 5/2003 | Edmonson et al. | |
| 6,603,351 B2 | 8/2003 | Suzuki | |
| 6,606,483 B1 | 8/2003 | Baker et al. | |
| 6,759,916 B2 | 7/2004 | Ishizaki et al. | |
| 6,771,130 B2 | 8/2004 | Hasegawa et al. | |
| 6,859,104 B2 | 2/2005 | Toncich et al. | |
| 6,865,399 B2 | 3/2005 | Fujioka et al. | |
| 6,946,847 B2 | 9/2005 | Nishimori et al. | |
| 6,950,637 B2 | 9/2005 | Kim | |
| 6,992,543 B2 | 1/2006 | Luetzelschwab et al. | |
| 7,009,455 B2 | 3/2006 | Toncich et al. | |
| 7,010,073 B2 * | 3/2006 | Black et al. | 375/355 |
| 7,126,386 B2 * | 10/2006 | Tumer et al. | 327/70 |
| 7,151,411 B2 | 12/2006 | Martin et al. | |
| 7,176,634 B2 | 2/2007 | Kitamura et al. | |
| 7,187,231 B2 | 3/2007 | McGrath et al. | |
| 7,202,734 B1 | 4/2007 | Raab | |
| 7,215,933 B1 | 5/2007 | Tse et al. | |
| 7,417,508 B1 | 8/2008 | Quaglietta | |
| 7,443,236 B2 | 10/2008 | Dow et al. | |
| 7,509,100 B2 | 3/2009 | Toncich | |
| 7,512,386 B2 | 3/2009 | Kalajo et al. | |
| 7,567,782 B2 | 7/2009 | Liu et al. | |
| 7,580,684 B2 | 8/2009 | Cyr et al. | |
| 7,616,054 B2 | 11/2009 | Jeon et al. | |
| 7,782,134 B2 | 8/2010 | Drogi et al. | |
| 7,868,699 B2 | 1/2011 | Ono et al. | |
| 7,893,763 B2 | 2/2011 | Andrews | |
| 7,893,769 B2 | 2/2011 | Asano | |
| 7,911,277 B2 | 3/2011 | Paul et al. | |
| 7,917,170 B2 | 3/2011 | Zhitnitsky | |
| 8,018,277 B2 | 9/2011 | Drogi et al. | |
| 8,072,272 B2 | 12/2011 | Zhao et al. | |
| 8,111,111 B2 | 2/2012 | Van Bezooijen | |
| 8,131,232 B2 | 3/2012 | Muhammad | |
| 8,140,033 B2 | 3/2012 | Chan et al. | |
| 8,213,886 B2 | 7/2012 | Blin | |
| 8,280,323 B2 | 10/2012 | Thompson | |
| 8,306,490 B2 | 11/2012 | Tanoue et al. | |
| 8,368,470 B2 | 2/2013 | Alidio et al. | |
| 8,576,013 B2 | 11/2013 | Coumou | |
| 2001/0020911 A1 * | 9/2001 | Cho et al. | 341/173 |
| 2002/0094037 A1 * | 7/2002 | Darabi et al. | 375/316 |
| 2002/0127983 A1 * | 9/2002 | Black et al. | 455/135 |
| 2003/0060227 A1 | 3/2003 | Sekine et al. | |
| 2003/0193997 A1 | 10/2003 | Dent et al. | |
| 2004/0132441 A1 * | 7/2004 | Livet et al. | 455/422.1 |
| 2004/0224649 A1 | 11/2004 | Shamsaifar | |
| 2005/0159119 A1 | 7/2005 | Kataoka et al. | |
| 2005/0221855 A1 | 10/2005 | Kuriyama et al. | |
| 2005/0225388 A1 | 10/2005 | Ramachandran et al. | |
| 2005/0227640 A1 | 10/2005 | Haque et al. | |
| 2006/0028301 A1 | 2/2006 | Kamata et al. | |
| 2006/0053321 A1 | 3/2006 | Mizusawa | |
| 2006/0160501 A1 | 7/2006 | Mendolia et al. | |
| 2006/0164162 A1 | 7/2006 | Dauphinee et al. | |
| 2006/0166664 A1 * | 7/2006 | Livet et al. | 455/422.1 |
| 2006/0261895 A1 | 11/2006 | Kocaman et al. | |
| 2007/0109698 A1 * | 5/2007 | Kim | 361/56 |
| 2007/0197180 A1 | 8/2007 | McKinzie, III et al. | |
| 2007/0218844 A1 | 9/2007 | Alanen et al. | |
| 2007/0222523 A1 | 9/2007 | Arell | |
| 2007/0222697 A1 | 9/2007 | Caimi et al. | |
| 2007/0291173 A1 * | 12/2007 | Hsin | 348/538 |
| 2008/0242237 A1 | 10/2008 | Rofougaran et al. | |
| 2008/0266021 A1 | 10/2008 | Van Bezooijen et al. | |
| 2008/0284539 A1 | 11/2008 | Tateoka et al. | |
| 2008/0290947 A1 | 11/2008 | Dawe | |
| 2009/0002077 A1 | 1/2009 | Rohani et al. | |
| 2009/0135536 A1 * | 5/2009 | Kappes et al. | 361/57 |
| 2009/0318093 A1 | 12/2009 | Prikhodko et al. | |
| 2010/0081410 A1 | 4/2010 | Kaido et al. | |
| 2010/0308933 A1 | 12/2010 | See et al. | |
| 2010/0321086 A1 | 12/2010 | See et al. | |
| 2011/0018632 A1 | 1/2011 | Pletcher et al. | |
| 2011/0316636 A1 | 12/2011 | Zhao et al. | |
| 2012/0112834 A1 | 5/2012 | Van Bezooijen | |

FOREIGN PATENT DOCUMENTS

| | | |
|---|---|---|
| CN | 1677848 A | 10/2005 |
| CN | 1826727 A | 8/2006 |
| CN | 1870423 A | 11/2006 |
| CN | 101095285 A | 12/2007 |
| CN | 101432973 A | 5/2009 |
| CN | 101502004 A | 8/2009 |
| EP | 0982852 A2 | 3/2000 |
| EP | 1727279 A1 | 11/2006 |
| EP | 1916772 A1 | 4/2008 |
| GB | 2356093 A | 5/2001 |
| JP | 562262508 A | 11/1987 |
| JP | S6361812 U | 4/1988 |
| JP | H02161769 A | 6/1990 |
| JP | H03128336 U | 12/1991 |
| JP | H04207521 A | 7/1992 |
| JP | H07263986 A | 10/1995 |
| JP | H08167819 A | 6/1996 |
| JP | 11055047 A | 2/1999 |
| JP | 2000150779 A | 5/2000 |
| JP | 2000512460 A | 9/2000 |
| JP | 2001068941 A | 3/2001 |
| JP | 3192907 B2 | 7/2001 |
| JP | 2002535860 A | 10/2002 |
| JP | 2003504929 A | 2/2003 |
| JP | 2003087129 A | 3/2003 |
| JP | 2003516083 A | 5/2003 |
| JP | 2003174367 A | 6/2003 |
| JP | 2004085446 A | 3/2004 |
| JP | 2005045440 A | 2/2005 |
| JP | 2005128721 A | 5/2005 |
| JP | 2005210316 A | 8/2005 |

(56) References Cited

FOREIGN PATENT DOCUMENTS

| | | |
|---|---|---|
| JP | 2005524325 A | 8/2005 |
| JP | 2005268895 A | 9/2005 |
| JP | 2005294894 A | 10/2005 |
| JP | 2006074595 A | 3/2006 |
| JP | 2006279190 A | 10/2006 |
| JP | 2007013790 A | 1/2007 |
| JP | 2007503167 A | 2/2007 |
| JP | 2007060455 A | 3/2007 |
| JP | 2007081593 A | 3/2007 |
| JP | 2007104355 A | 4/2007 |
| JP | 2007531470 A | 11/2007 |
| JP | 2008516508 A | 5/2008 |
| JP | 2008521318 A | 6/2008 |
| JP | 2008521319 A | 6/2008 |
| JP | 2008219758 A | 9/2008 |
| JP | 2008288769 A | 11/2008 |
| JP | 2010081383 A | 4/2010 |
| WO | WO0105028 | 1/2001 |
| WO | 03094345 A2 | 11/2003 |
| WO | WO2004034569 | 4/2004 |
| WO | 2005006832 A2 | 1/2005 |
| WO | 2005101649 A2 | 10/2005 |
| WO | 2005101678 A2 | 10/2005 |
| WO | WO2006038167 A1 | 4/2006 |
| WO | 2006054245 A1 | 5/2006 |
| WO | WO2006054246 A1 | 5/2006 |
| WO | 2007107633 A1 | 9/2007 |
| WO | 2008014029 A2 | 1/2008 |
| WO | WO-2008114455 A1 | 9/2008 |

OTHER PUBLICATIONS

A Bezooijen et al., "Power Amplifier Protection by Adaptive Output Power Control", IEEE JSSC, vol. 42, No. 9, Sep. 2007, pp. 1834-1841.

F Carrara et al., "A Methodology for Fast VSWR Protection Implemented in A Monolithic 3-W 55% PAE RF CMOS Power Amplifier", IEEE JSSC, vol. 43, No. 9, Sep. 2008, pp. 2057-2066.

D Su and W McFarland, "An IC for Linearizing RF Power Amplifiers Using Envelope Elimination and Restoration", IEEE JSSC, vol. 33, No. 12, Dec. 1998, pp. 2252-2258.

S A Sanielevici et al., "A 900-MHz Transceiver Chipset for Two-Way Paging Applications", IEEE JSSC, vol. 33, No. 12, Dec. 1998. pp. 2160-2168.

Adar, A. et al., "A High Efficiency Single Chain GaAs MESFET MMIC Dual Band Power Amplifier for GSM/DCS Handsets", Gallium Arsenide Integrated Circuit (GaAs IC) Symposium, 1998. Technical Digest 1998., 20th Annual; Digital Object Identifier: 10.1109/GAAS.1998.722629; Publication Year: 1998, pp. 69-72.

Chowdhury D et al., "A single-chip highly linear 2.4GHz 30dBm power amplifier in 90nm CMOS", Solid-State Circuits Conference—Digest of Technical Papers, 2009, ISSCC 2009, IEEE International, IEEE, Piscataway, NJ, USA, Feb. 8, 2009 (Feb. 8, 2009), pp. 378-379,379A, XP031466144, ISBN, 978-1-42443458-9.

International Search Report and Written Opinion—PCT/US2010/046025—International Search Authority, European Patent Office,Dec. 23, 2010.

Minsik Ahn, et al., "A Novel Multi-Stack Device Structure and its Analysis for High Power CMOS Switch Design", Microwave Symposium, 2007. IEEE/MTT-S International, IEEE, PI, Jun. 1, 2007 (Jun. 1, 2007), pp. 1393-1396, XP031112198, ISBN, 978-1-4244-0687-6.

Tongqiang Gao, et al., "A novel CMOS transmitter front-end for mobile RFID reader", Radio Frequency Integrated Circuits Symposium, 2009. RFIC 2009. IEEE, IEEE, Piscataway, NJ, USA, Jun. 7, 2009 (Jun. 7, 2009), pp. 105-108, XP031480236, ISBN, 978-1-4244-3377-3.

Vaha-Heikkila T. et al., "A 20-50 Ghz Reconfigurable Match Network for Power Amplifier Applications", Microwave Symposium Digest, 2004 IEEE MTT-S International; vol. 2 Digital Object Identifier: 10.1109/MWSYM.2004.1339059; Publication Year: 2004, pp. 717-720 vol. 2.

van Bezooijen, A., et al., "Adaptive Impedance-Matching Techniques for Controlling L Networks", Circuits and Systems I: Regular Papers, IEEE Transactions on; vol. 57 , Issue: 2; Digital Object Identifier: 10.1 109/TCSI.2009.2023764 Feb. 2010, pp. 495-505.

Wang et al., "A Nonlinear Capacitance Cancellation Technique and its Application to a CMOS Class AB Power Amplifier," 2001, IEEE Radio Frequency Integrated Circuits Symposium, May 20, 2001, pp. 39-42, XP010551317.

Yao-Jen Chuang, et al., "A novel bubble tolerant thermometer-to-binary encoder for flash A/D converter", VLSI Design, Automation and Test, 2005. (VLSI-TSA-DAT). 2005 IEEE VLSI 20050427; 20050427-20050429 Piscataway, NJ, USA,IEEE, US, Apr. 27, 2005 (Apr. 27, 2005), pp. 315-318, XP010829593, DOI: DOOI:10.1109/VDAT.2005.1500084 ISBN: 978-0-7803-9060-7 the whole document.

* cited by examiner

PROTECTION CIRCUIT FOR POWER AMPLIFIER

CLAIM OF PRIORITY UNDER 35 U.S.C. §119

The present Application for Patent claims priority to Provisional U.S. application Ser. No. 61/235,313, entitled "VSWR PROTECTION FOR POWER AMPLIFIERS," filed Aug. 19, 2009, assigned to the assignee hereof, and expressly incorporated herein by reference.

BACKGROUND

I. Field

The present disclosure relates generally to electronics, and more specifically to a protection circuit for a power amplifier.

II. Background

A wireless communication device typically includes a transmitter to support data transmission. The transmitter typically includes a power amplifier to amplify a radio frequency (RF) signal and provide high output power. The power amplifier may be designed to drive a particular load impedance, e.g., 50 Ohms. The load impedance may vary due to various disturbances and may result in the power amplifier observing a high peak voltage. The high peak voltage may exceed a level that can ensure reliable operation of the power amplifier. It may be desirable to detect for high peak voltage and perform corrective actions so that the power amplifier can be protected from high peak voltage.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for protecting a power amplifier from high peak voltage are described herein. The techniques may be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques for a wireless communication device is described below.

Figure 1:
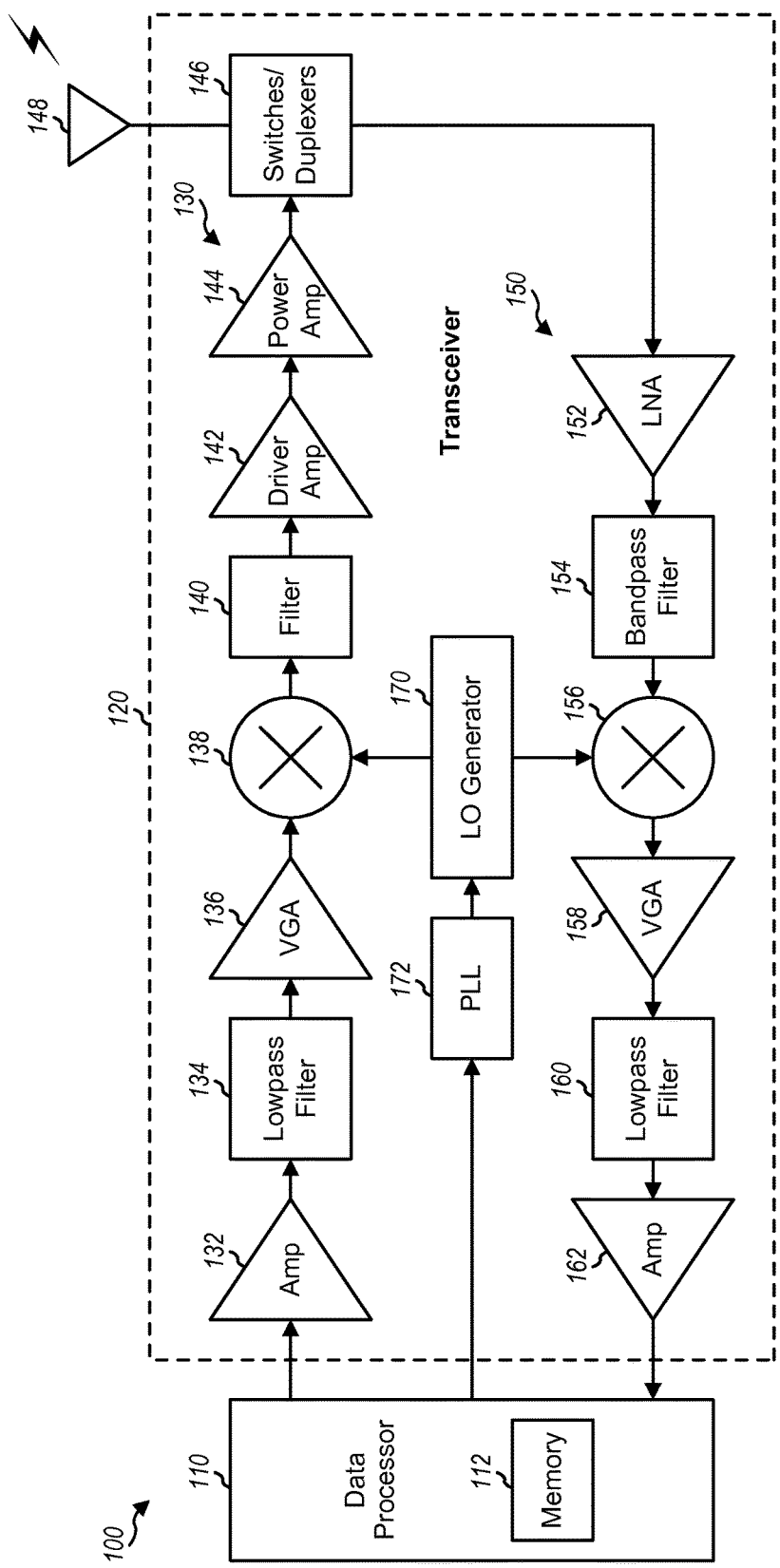
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output baseband signal to transmitter 130. Within transmitter 130, the analog output baseband signal is amplified by an amplifier (Amp) 132, filtered by a lowpass filter 134 to remove images caused by digital-to-analog conversion, amplified by a variable gain amplifier (VGA) 136, and upconverted from baseband to RF by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by a low noise amplifier (LNA) 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input baseband signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

For a power amplifier used in a wireless device, high output power as well as high power-added efficiency (PAE) are important. The power amplifier may be fabricated on an IC in order to obtain smaller size, lower cost, and other advantages. To obtain high output power and high PAE, the silicon-based power amplifier may be connected to a higher power supply voltage or possibly to a battery directly. Furthermore, to reduce cost as well as insertion loss, the power amplifier may be coupled to an antenna without going through an isolator, which is typically used to attenuate reflection signal due to load mismatch. As a result, the gate and drain of a transistor in the power amplifier may observe high peak voltage. The high peak voltage may be 3 to 4 times the power supply voltage when there is severe impedance mismatch at the output of the power amplifier. The severe load mismatch may correspond to a high voltage standing wave ratio (VSWR), e.g., VSWR of 10:1 or more. A protection circuit may be used to limit the peak voltage and protect the transistors in the power amplifier from breakdown. A protection circuit may also be referred to as a VSWR protection circuit, a PA protection circuit, etc.

Figure 2:
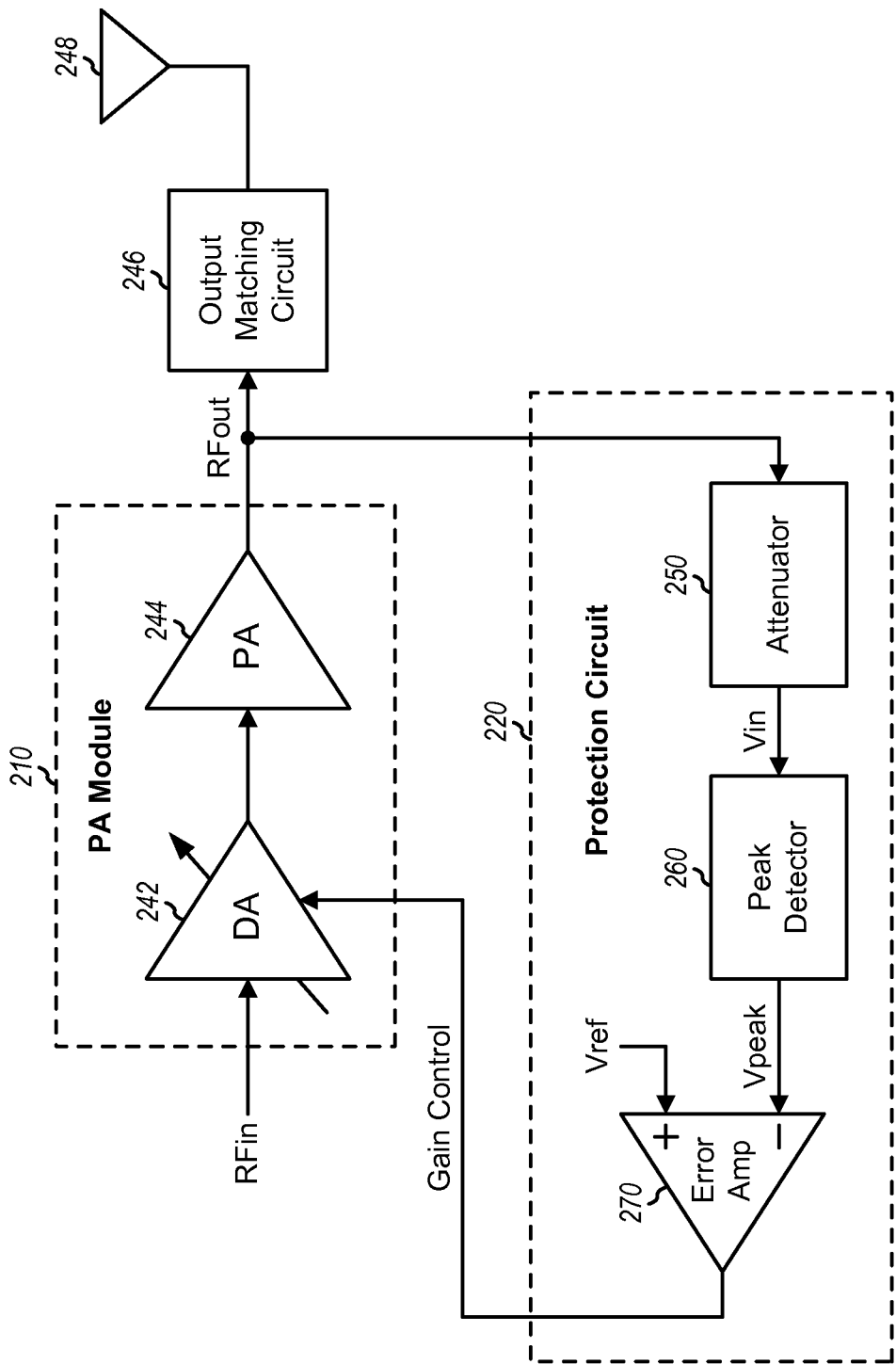
FIG. 2 shows a power amplifier (PA) module and a protection circuit.

FIG. 2 shows a block diagram of a PA module 210 and a protection circuit 220 to limit peak voltage. PA module 210 includes a driver amplifier (DA) 242 and a power amplifier 244. Driver amplifier 242 receives and amplifies an input RF signal (RFin) with a configurable gain and provides an intermediate RF signal. Power amplifier 244 further amplifies the intermediate RF signal and provides an output RF signal (RFout). A matching circuit 246 performs output impedance matching for power amplifier 244 and is coupled between power amplifier 244 and an antenna 248. Matching circuit 246 may match a low output impedance (e.g., 2 to 4 Ohms) of power amplifier 244 to a moderate impedance (e.g., 50 Ohms) of antenna 248.

Within protection circuit 220, an attenuator 250 receives the RFout signal from power amplifier 244 and provides a peak detector input signal (Vin), which may be an attenuated version of the RFout signal. A peak detector 260 detects for peak voltage of the Vin signal and provides a peak detector output signal (Vpeak) indicative of the detected peak voltage. An error amplifier 270 receives the Vpeak signal from peak detector 260 at an inverting input and a reference voltage (Vref) at a non-inverting input. Error amplifier 270 determines the error between the Vpeak signal and the Vref voltage and provides a gain control signal based on the result of the comparison. The gain of driver amplifier 242 is adjusted based on the gain control signal.

As shown in FIG. 2, PA module 210 and protection circuit 220 are coupled in a negative feedback loop. Protection circuit 220 senses the peak voltage of the RFout signal and reduces the gain of driver amplifier 242 when the peak voltage exceeds a predetermined level, which is set by the Vref voltage. The reduced gain of driver amplifier 242 would reduce the RFout signal level, which would in turn reduce the peak voltage. Protection circuit 220 can thus reduce and limit the peak voltage of the RFout signal by reducing the gain of driver amplifier 242.

Protection circuit 220 can protect transistors in power amplifier 244 from breakdown but has some drawbacks. First, protection circuit 220 may cause the RFout signal to toggle between two output power levels. When high peak voltage exceeding Vref is detected (e.g., due to severe load mismatch), error amplifier 270 provides a gain control to reduce the gain of driver amplifier 242, which then reduces the RFout signal level. Protection circuit 220 has limited bandwidth and may be unable to detect and act on the smaller RFout signal right away. The RFout signal may continue to decrease to a lower level. Protection circuit 220 may detect the lower level of the RFout signal after a certain delay and may then increase the gain of driver amplifier 242 to the original level. The RFout signal may then increase to the original high level, which may in turn cause protection circuit 220 to reduce the gain of driver amplifier 242. This sequence of events may repeat periodically until the load mismatch is changed. The toggling of the RFout signal level may be due to difficulty in maintaining the envelope of the RFout signal steady in a situation of severe load mismatch. The toggling of the RFout signal level may result in a dropped call, which may be undesirable.

Second, protection circuit 220 may not be able to deal with amplitude modulation (if any) on the RFout signal. The bandwidth of the feedback loop may be set as high as possible in order to react quickly to high peak voltage. If the RFout signal has amplitude modulation, then the feedback loop will follow the time-varying envelope of the RFout signal, and the gain control signal from error amplifier 270 may continually change. As a result, the RFout signal may be modulated by the feedback loop.

Third, protection circuit 220 includes various analog circuits that may be sensitive to IC process, voltage, and temperature (PVT) variations. The loop gain and phase of the feedback loop may be dependent on the gain and delay of analog circuits such as error amplifier 270. This dependency of the feedback loop characteristics on the analog circuit characteristics may make it more difficult to maintain stability for the feedback loop. Power amplifier 244 may oscillate to due loop instability.

Figure 3:
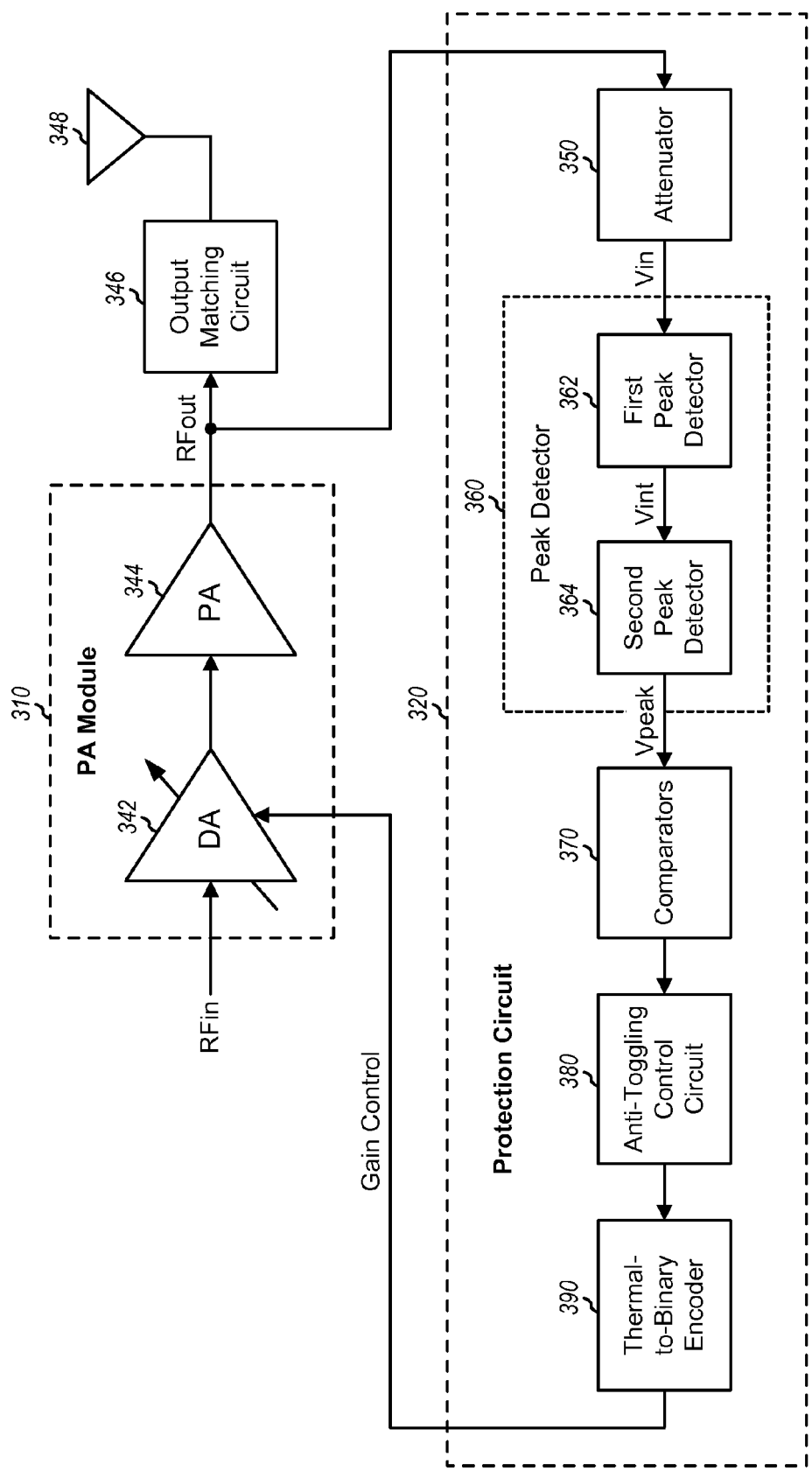
FIG. 3 shows a PA module and an improved protection circuit.

FIG. 3 shows a block diagram of an exemplary design of a PA module 310 and a protection circuit 320 to limit peak voltage. PA module 310 includes a driver amplifier 342 and a power amplifier 344, which may correspond to driver amplifier 142 and power amplifier 144 in FIG. 1. Driver amplifier 342 receives and amplifies an RFin signal with a configurable gain and provides an intermediate RF signal. Power amplifier 344 further amplifies the intermediate RF signal and provides an RFout signal. A matching circuit 346 performs output impedance matching for power amplifier 344 and is coupled between power amplifier 344 and an antenna 348.

Within protection circuit 320, an attenuator 350 receives the RFout signal from power amplifier 344 and provides a peak detector input signal (Vin), which may be an attenuated version of the RFout signal. A peak detector 360 detects for peak voltage of the Vin signal and provides a peak detector output signal (Vpeak) indicative of the detected peak voltage. In the exemplary design shown in FIG. 3, peak detector 360 includes a first peak detector 362 coupled in series with a second peak detector 364. First peak detector 362 detects for peak voltage of the Vin signal and provides an intermediate signal (Vint) indicative of the detected peak voltage. Second peak detector 364 detects for peak voltage of the Vint signal and provides the Vpeak signal indicative of the detected peak voltage. Peak detectors 362 and 364 may collectively have a fast response to rising amplitude of the RFout signal and a slow response to falling amplitude of the RFout signal. The Vpeak signal may thus track the rising amplitude of the RFout signal but may lag the falling amplitude of the RFout signal. A set of comparators 370 compares the Vpeak signal from peak detector 360 against a set of reference voltages and provides a set of comparator output signals. An anti-toggling control circuit 380 receives the comparator output signals and generates at least one control signal having hysteresis to avoid toggling between two output power levels. A thermal-to-binary encoder 390 receives the at least one control signal from control circuit 380 and generates at least one gain control signal, which forms a gain control for driver amplifier 342.

As shown in FIG. 3, PA module 310 and protection circuit 320 are coupled in a negative feedback loop. Protection circuit 320 senses the peak voltage of the RFout signal and reduces the gain of driver amplifier 342 when high peak voltage is detected. The reduced gain of driver amplifier 342 would reduce the amplitude of the RFout signal, which would in turn reduce the peak voltage. Protection circuit 320 in the feedback loop can thus reduce and limit the peak voltage of the RFout signal by reducing the gain of driver amplifier 342.

Protection circuit 320 in FIG. 3 includes several features not present in protection circuit 220 in FIG. 2. First, error amplifier 270 (which is an analog circuit) in FIG. 2 is replaced with comparators 370, anti-toggling control circuit 380, and thermal-to-binary encoder 390 (which are digital circuits). The digital circuits in protection circuit 320 may be readily combined with other digital gain control functions for PA module 310. Furthermore, the digital circuits may result in more deterministic loop gain variation and loop stability for the feedback loop in FIG. 3. This may avoid instability issues related to PVT variations, which is one of the drawbacks of protection circuit 220 in FIG. 2.

Second, peak detectors 362 and 364 can quickly follow rising amplitude of the RFout signal and slowly follow falling amplitude of the RFout signal. This may allow protection circuit 320 to quickly reduce the gain of driver amplifier 342 when high peak voltage is detected. This may also allow protection circuit 320 to handle amplitude modulation on the RFout signal, since the gain will not be changed quickly when the amplitude of the RFout signal falls. Protection circuit 320 can thus handle both constant amplitude RF signal and amplitude modulated RF signal. Peak detector 364 may be either included or bypassed for applications with constant amplitude RF signal.

Third, anti-toggling control circuit 380 can provide hysteresis to avoid toggle between two output power levels when high peak voltage is detected. The gain of driver amplifier 342 may be reduced when the RFout signal exceeds a high threshold (e.g., due to severe load mismatch). This would cause the RFout signal to decrease in amplitude. However, the gain of driver amplifier 342 may be increased only when the RFout signal falls below a low threshold, which may be set lower than the high threshold by a hysteresis amount. The hysteresis may avoid toggling of the gain of driver amplifier 342 when high peak voltage is detected and may avoid dropped call due to toggling. The hysteresis may also avoid toggling of the gain due to ringing in the RFout signal envelope when the gain is changed. The hysteresis may further allow protection circuit 320 to handle amplitude modulation on the RFout signal.

Protection circuit 320 in FIG. 3 can protect transistors in power amplifier 344 from breakdown while avoiding the drawbacks of protection circuit 220 in FIG. 2. Furthermore, protection circuit 320 may be implemented with programmable or adjustable components that can provide flexibility to program the feedback loop characteristics, as described below.

Figure 4:
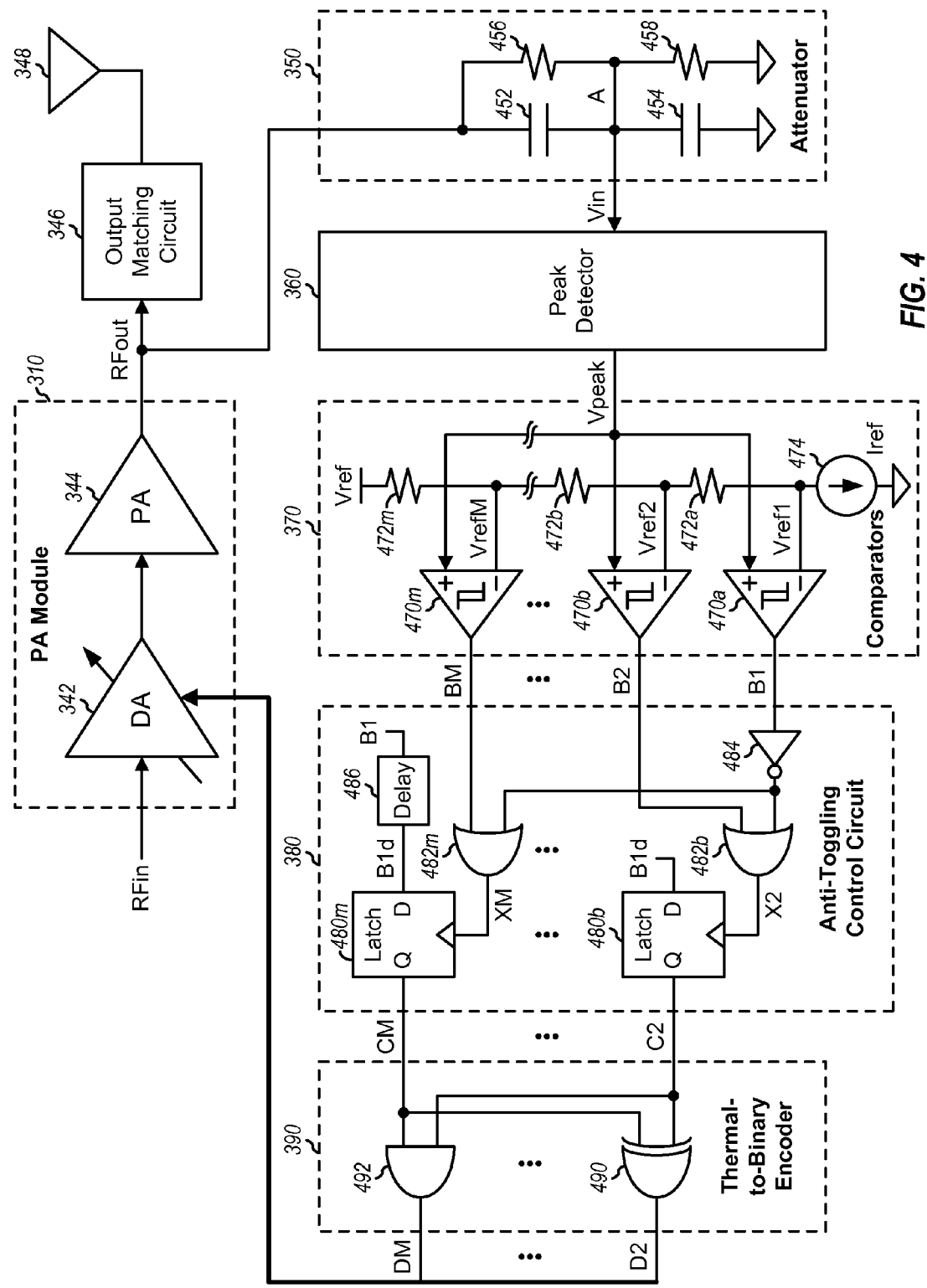
FIG. 4 shows various circuits within the improved protection circuit in FIG. 4.

FIG. 4 shows a schematic diagram of an exemplary design of attenuator 350, comparators 370, anti-toggling control circuit 380, and thermal-to-binary encoder 390 in FIG. 3. Peak detector 360 is described below.

In the exemplary design shown in FIG. 4, attenuator 350 includes capacitors 452 and 454 and resistors 456 and 458. Capacitor 452 and resistor 456 are coupled in parallel and have their top ends receiving the RFout signal and their bottom ends coupled to node A. Capacitor 454 and resistor 458 are coupled in parallel and have their top ends coupled to node A and their bottom ends coupled to circuit ground. Capacitors 452 and 454 operate as a power coupler and also as a voltage divider for the dynamic component of the RFout signal. Resistors 456 and 458 operate as a voltage divider for the direct current (DC) component of the RFout signal. The Vin signal at node A is an attenuated version of the RFout signal, which may be large during severe load mismatch. The voltage divider protects peak detector 360 from high voltage during severe load mismatch. In general, any number of capacitors may be used to form a voltage divider. A programmable voltage divider may also be formed with one or more capacitors (e.g., capacitor 454) having a configurable capacitance value. The capacitive divider ratio may be selected such that at the worst-case load mismatch (e.g., for VSWR of 10:1 or possibly higher), the Vin signal is voltage-limited to ensure proper operation of peak detector 360. Attenuator 350 may also be implemented with only capacitors 452 and 454, or only resistors 456 and 458.

As shown in FIG. 4, peak detector 360 detects the peak voltage of the Vin signal and provides the Vpeak signal. Peak detector 360 can quickly follow the rising amplitude of the RFout signal but has a slow response to the falling amplitude of the RFout signal.

In the exemplary design shown in FIG. 4, comparators 370 include a set of M comparators 470a through 470m, where M may be two or greater and M=3 in one exemplary design. M resistors 472a through 472m are coupled in series, with the top end of resistor 472m being coupled to the Vref voltage. A current source 474 has one end coupled to the bottom end of resistor 472a and the other end coupled to circuit ground. The bottom ends of resistors 472a through 472m provide M reference voltages, Vref1 through VrefM, respectively, where Vref1<Vref2<. . . <VrefM. Comparators 470a through 470m receive the same Vpeak signal at one input and further receive the Vref1 through VrefM voltages, respectively, at the other input. Each comparator 470 compares the Vpeak signal against its reference voltage (Vrefm) and provides a corresponding comparator output signal (Bm) based on the comparison result, for m ∈{1, . . . , M}. The Bm comparator output signal may be at logic high if the Vpeak signal exceeds Vrefm and may be at logic low otherwise.

Driver amplifier 342 may be set to one of M discrete gains G1 through GM based on the gain control from protection circuit 320, where G1>G2, . . . >GM. Gains G2 through GM may be selected when the Vpeak signal exceeds Vref2 through VrefM, respectively. Gain G1 may be selected when the Vpeak signal is below Vref2. More comparators 470 and more reference voltages may be used to support more discrete gains with finer resolution.

In the exemplary design shown in FIG. 4, anti-toggling control circuit 380 includes M−1 D-type latches 480b through 480m, M−1 OR gates 482b through 482m, an inverter 484, and a delay circuit 486. Inverter 484 receives and inverts the B1 signal from comparator 470a. Delay circuit 486 receives and delays the B1 signal and provides a delayed B1 signal (B1d). Delay circuit 486 may be implemented with an even number of inverters coupled in series. OR gates 482b through 482m receive the same output signal from inverter 484 at one input and further receive the B2 through BM signals from comparators 470b through 470m, respectively, at the other input. Latches 480b through 480m receive the same delayed B1 signal from delay circuit 486 at a data (D) input and further receive X2 through XM signals from OR gates 482b through 482m, respectively, at a clock input. Latches 480b through 480m provide M−1 control signals C2 through CM, respectively.

Figure 5:
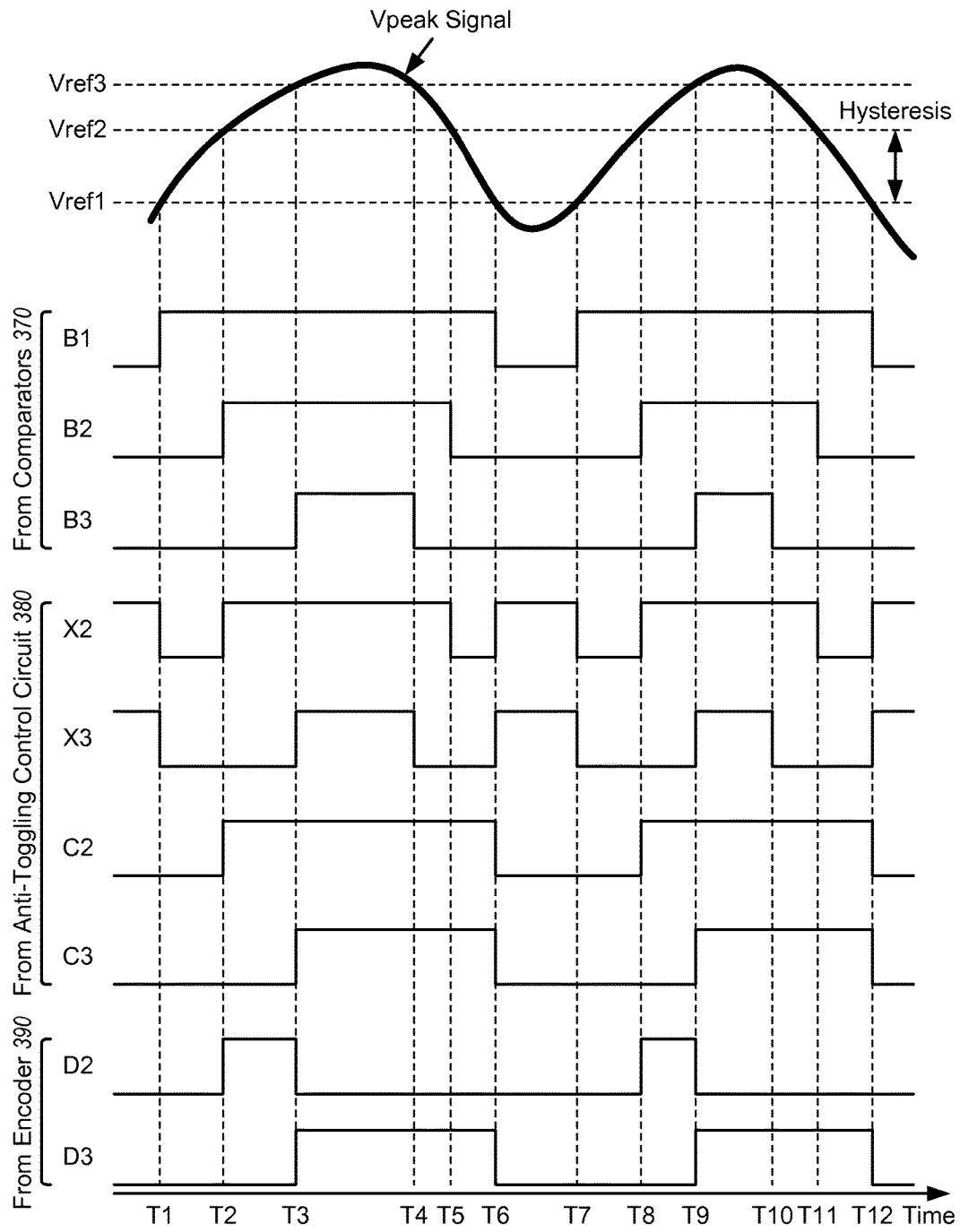
FIG. 5 shows a timing diagram for various signals from the circuits in FIG. 4.

FIG. 5 shows a timing diagram illustrating the operation of comparators 470 and anti-toggling control circuit 380 in FIG. 4, for a case in which M=3. The Vpeak signal from peak detector 360 is shown at the top of FIG. 5 along with three reference voltages, Vref1, Vref2 and Vref3. The difference between Vref1 and Vref2 is the amount of hysteresis.

At time T1, the Vpeak signal exceeds Vref1, and the B1 signal from comparator 470a transitions to logic high. At time T2, the Vpeak signal exceeds Vref2, and the B2 signal from comparator 470b transitions to logic high. At time T3, the Vpeak signal exceeds Vref3, and the B3 signal from comparator 470m transitions to logic high. At time T4, the Vpeak signal falls below Vref3, and the B3 signal transitions back to logic low. At time T5, the Vpeak signal falls below Vref2, and the B2 signal transitions back to logic low. At time T6, the Vpeak signal falls below Vref1, and the B1 signal transitions back to logic low. Each comparator output signal is thus set to logic high or logic low depending on whether the Vpeak signal is above or below the reference voltage used for that comparator output signal.

The X2 signal from OR gate 482b is at logic high (i) from time T2 to time T5 when the B2 signal is at logic high and also (ii) from time T6 to time T7 when the B1 signal is at logic low. Similarly, the X3 signal from OR gate 482m is at logic high (i) from time T3 to time T4 when the B3 signal is at logic high and also (ii) from time T6 to time T7 when the B1 signal is at logic low.

The C2 signal from latch 470b transitions to logic high at time T2 due to the rising edge of the B2 signal and transitions to logic low at time T6 due to the falling edge of the B1 signal. Similarly, the C3 signal from latch 470m transitions to logic high at time T3 due to the rising edge of the B3 signal and transitions to logic low at time T6 due to the falling edge of the B1 signal. Thus, the Cm digital control signal from each latch (i) transitions to logic high when the corresponding Bm comparator output signal transitions to logic high and (ii) transitions to logic low when the B1 comparator output signal transitions to logic low.

As shown in FIGS. 4 and 5, the B1 signal is used as a functional control bit. The C2 through CM signals have the same rising edges as the B2 through BM signals, respectively, and the same falling edges as the B1 signal. In particular, when the B2 through BM signals transition to logic low, the C2 through CM signals remain at logic high until the B1 signal transitions to logic low. This function is realized by latches 480b through 480m and OR gates 482b through 482m in FIG. 4. The input of each latch 480 is passed to its output only when a trigger signal from the corresponding OR gate 482 transitions to logic high.

A well-controlled and adjustable hysteresis may be obtained between the B2 through BM signals from comparators 470 and the C2 through CM signals from latches 480. The hysteresis may be used to avoid toggling of the RFout signal between two output power levels.

The C2 through CM signals are indicative of the desired gain for driver amplifier 342 and are given in a first digital format. Thermal-to-binary encoder 390 receives the C2 through CM signals and generates D2 through DM signals indicative of the desired gain and given in a second digital format used for driver amplifier 342. The D2 through DM signals may correspond to gains G2 through GM, respectively. At most one of the D2 through DM signals may be set to logic high to select the corresponding gain. Gain G1 may correspond to the case in which all of the D2 through DM signals are at logic low.

FIG. 4 shows an exemplary design of thermal-to-binary encoder 390 for the case in which M=3. In this exemplary design, thermal-to-binary encoder 390 includes an exclusive OR (XOR) gate 490 and an AND gate 492. XOR gate 490 receives the C2 and CM signals and provides the D2 signal. AND gate 492 receives the C2 and CM signals and provides the DM signal. In general, M−2 XOR gates may be used to generate D2 through D(M−1) signals. Each XOR gate may receive Cm and C(m+1) signals and provide a corresponding Dm signal, where m ∈ {2, . . . , M−1}. AND gate 492 may generate the DM signal based on the C2 and CM signals. Although not shown in FIG. 4 for simplicity, additional logic circuits may combine the D2 through DM signals with other gain control signals used for existing gain control functions to generate final gain control signals for driver amplifier 342.

FIG. 5 shows the D2 and D3 signals from thermal-to-binary encoder 390 for the case in which M=3. The D2 signal is at logic high when the C2 signal is at logic high and the C3 signal is not at logic high. The D3 signal is at logic high when the C3 signal is at logic high. At most one of the D2 and D3 signals is at logic high at any given moment. A lowest gain G3 may be selected when the D3 signal is at logic high. A medium gain G2 may be selected when the D2 signal is at logic high. A highest gain G1 may be selected when the D2 and D3 signals are both at logic low.

FIG. 4 shows an exemplary design of protection circuit 320, which can protect the transistors in power amplifier 344 from breakdown, avoid toggling of the RFout signal between two output power levels, and provide other advantages. A protection circuit may also be implemented in other manners.

Figure 6:
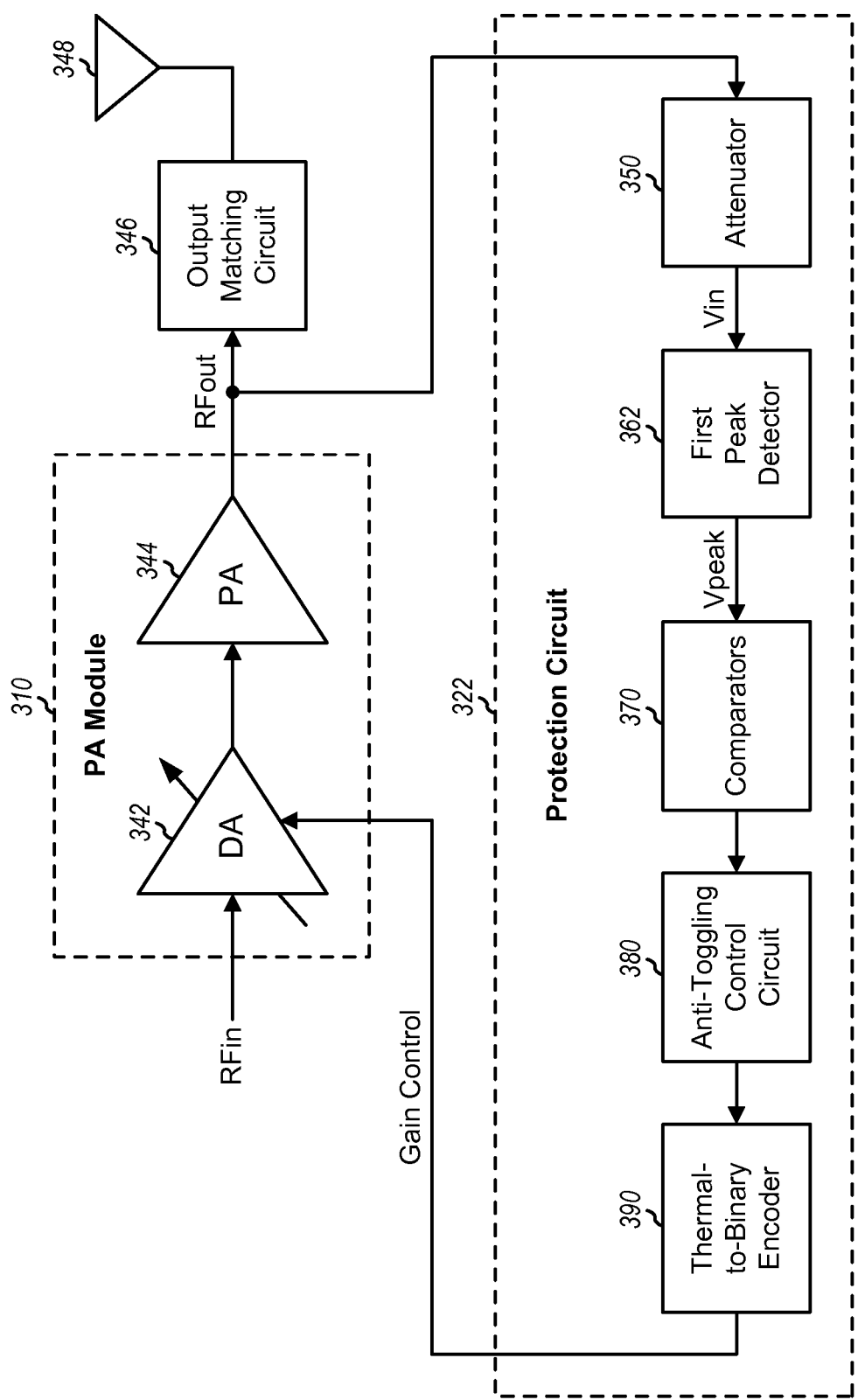
FIGS. 6 and 7 show two exemplary designs of the improved protection circuit.

FIG. 6 shows a block diagram of an exemplary design of a protection circuit 322, which includes all of the circuits in protection circuit 320 in FIG. 3 except for second peak detector 364. In this exemplary design, peak detector 362 provides its output as the Vpeak signal directly to comparators 370. Protection circuit 322 may be able to avoid toggling of the RFout signal based on hysteresis provided by anti-toggling control circuit 380.

Figure 7:
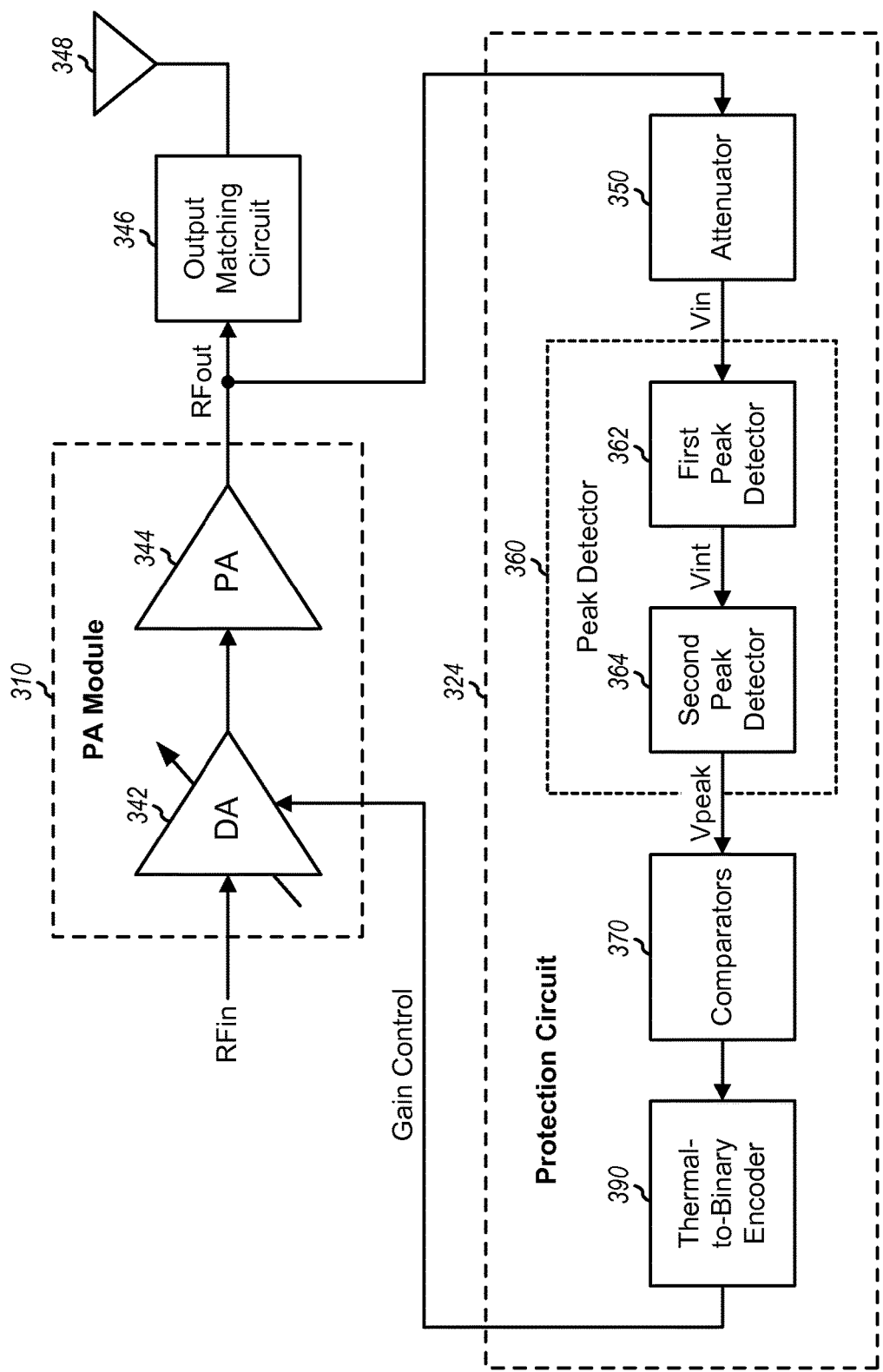

FIG. 7 shows a block diagram of an exemplary design of a protection circuit 324, which includes all of the circuits in protection circuit 320 in FIG. 3 except for anti-toggling control circuit 380. In this exemplary design, the comparator output signals from comparators 370 are provided directly to thermal-to-binary encoder 390. Protection circuit 324 may be able to avoid toggling of the RFout signal based on the slow response to falling amplitude of the RFout signal.

In general, toggling of the gain of driver amplifier 342 (and hence the amplitude of the RFout signal) may be avoided with only anti-toggling control circuit 380 (as shown in FIG. 6), or only peak detector 364 (as shown in FIG. 7), or both anti-toggling control circuit 380 and peak detector 364 (as shown in FIG. 3). The use of both anti-toggling control circuit 380 and peak detector 364 may be able to avoid toggling of the gain of driver amplifier 342 over a larger RFout signal range than either anti-toggling control circuit 380 or peak detector 364 alone.

FIGS. 3, 6 and 7 show exemplary designs in which the gain of driver amplifier 342 can be adjusted to vary the RFout signal level. In general, a transmitter gain may be adjusted to vary the RFout signal level. The transmitter gain may comprise the gain of a driver amplifier (if it is configurable) and/or the gain of one or more other circuits in the transmit path. For example, a protection circuit may vary the gain of VGA 136, the gain of a digital multiplier within data processor 110, and/or the gain of other circuits in a transmit path to vary the RFout signal level.

Figure 8:
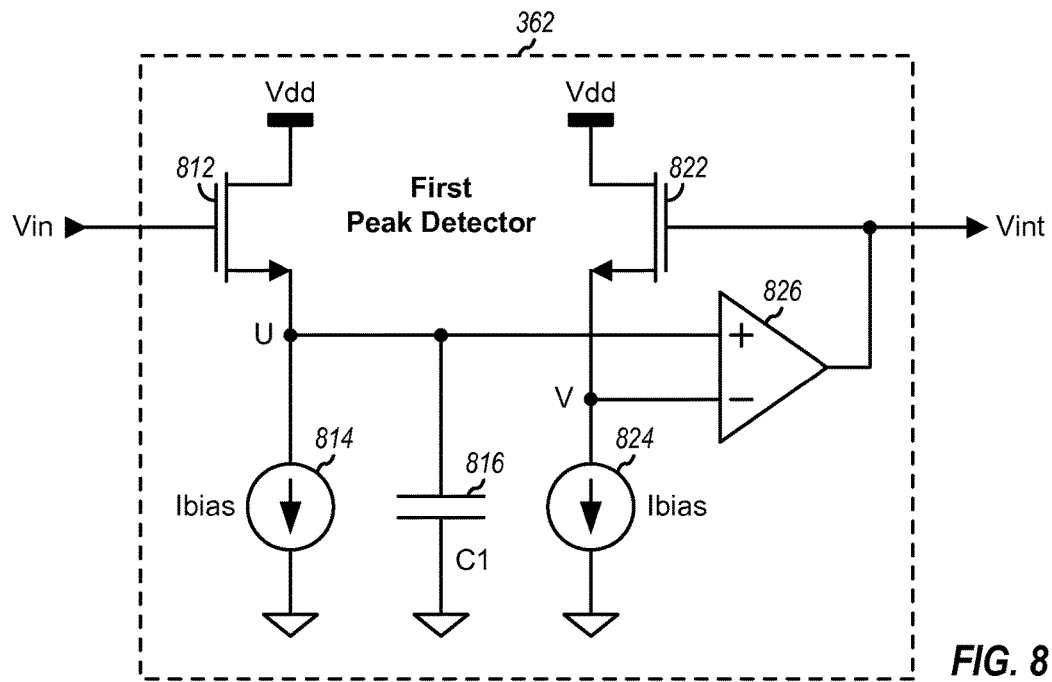
FIGS. 8 and 9 show two peak detectors for the improved protection circuit.

FIG. 8 shows a schematic diagram of an exemplary design of peak detector 362 in FIGS. 3, 6 and 7. Within peak detector 362, an N-channel metal oxide semiconductor (NMOS) transistor 812 has its gate receiving the Vin signal, its source coupled to node U, and its drain coupled to a power supply (Vdd). A current source 814 and a capacitor 816 are coupled in parallel and between node U and circuit ground. An NMOS transistor 822 has its gate coupled to the output of peak detector 362, its source coupled to node V, and its drain coupled to the Vdd supply. A current source 824 is coupled between node V and circuit ground. An operational amplifier (op-amp) 826 has its non-inverting input coupled to node U, its inverting input coupled to node V, and its output coupled to the gate of NMOS transistor 822. Current sources 814 and 824 each provide a current of Ibias.

Peak detector 362 operates as follows. NMOS transistor 812 acts as a rectifying forward-biased diode in the presence of the Vin signal and commutates charge on to capacitor 816 to obtain a positive rectified voltage. To make the charge transfer bi-directional for capacitor 816, current source 814 acts as a constant current sink such that peak detector 362 can respond to a time-varying waveform. The Vin signal may include a continuum of modulation frequencies within the system bandwidth. The C1 capacitance of capacitor 816 and the Ibias current of current source 814 may be selected such that the highest amplitude and the fastest rate of change of voltage (dv/dt) of an envelope on the Vin signal can be followed and tracked. The resulting rectified voltage on capacitor 816 is provided to high input impedance op-amp 826 to prevent charge leakage from capacitor 816.

The rectified voltage at node U is equal to the voltage at the gate of NMOS transistor 812 minus a gate-to-source voltage (Vgs) of NMOS transistor 812. Op-amp 826 is connected in a negative feedback loop and sets the gate voltage of NMOS transistor 822 such that the voltage at node V matches the voltage at node U. The gate voltage of NMOS transistor 822 should match the gate voltage of NMOS transistor 812 since NMOS transistor 822 and current source 824 are replicas of NMOS transistor 812 and current source 814. NMOS transistor 822 thus compensates for the Vgs voltage of NMOS transistor 812.

Figure 9:
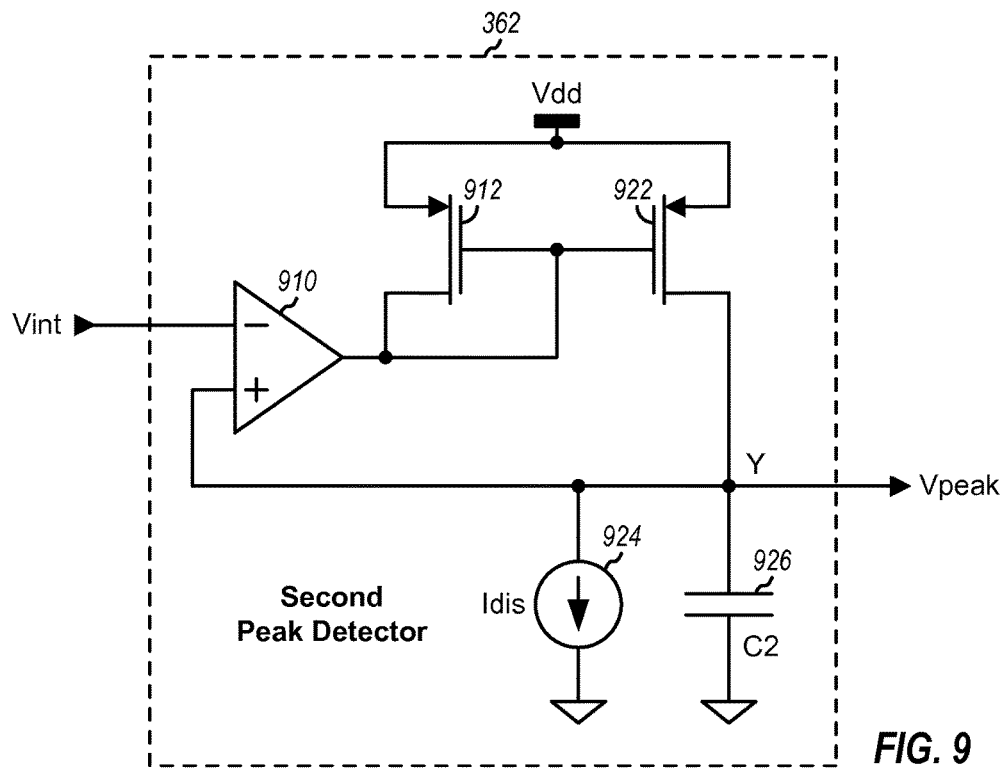

FIG. 9 shows a schematic diagram of an exemplary design of peak detector 364 in FIGS. 3 and 7. Within peak detector 364, an op-amp 910 has its inverting input receiving the Vint signal from peak detector 362 and its non-inverting input coupled to node Y, which is also the output of peak detector 364. P-channel metal oxide semiconductor (PMOS) transistors 912 and 922 are coupled as a current mirror and have their gates coupled together and their sources coupled to the Vdd supply. The gate and drain of PMOS transistor 912 are coupled together and to the output of op-amp 910. The drain of PMOS transistor 922 is coupled to node Y. A current source 924 and a capacitor 926 are coupled in parallel and between node Y and circuit ground. Current source 924 provides a current of Idis.

Peak detector 364 operates as follows. When the Vint signal goes high, the output of op-amp 910 goes low, and PMOS transistors 912 and 922 are both turned on. PMOS transistor 922 charges capacitor 926 with a relatively large amount of current. Conversely, when the Vint signal goes low, the output of op-amp 910 goes high, and PMOS transistors 912 and 922 are both turned off. Current source 924 acts as a constant current sink that removes charges from capacitor 926. However, the charging current from PMOS transistor 922 may be much larger than the discharging current from current source 924. For example, the charging current may be on the order of micro-Amperes (μA) whereas the discharging current may be on the order of nano-Amperes (nA). In this case, peak detector 364 can quickly react to rising amplitude of the Vint signal but may slowly react to falling amplitude of the Vint signal. The Idis current may be selected to obtain the desired slow response for the falling amplitude of the Vint signal. The Vpeak signal from peak detector 364 may then track the fast rising amplitude of the Vint signal and may lag the falling amplitude of the Vint signal, which may be desirable especially if the RFout signal is amplitude modulated.

FIGS. 8 and 9 show exemplary designs of peak detectors 362 and 364. As shown in FIG. 8, peak detector 362 can operate on an RF signal because of the high speed of NMOS transistor 812. As shown in FIG. 9, peak detector 364 can operate on an envelope signal due to the relatively slow speed of op-amp 910. Peak detectors 362 and 364 may also be implemented in other manners.

For a protection circuit for a power amplifier, a suitable peak detector should have fast response to rising amplitude (i.e., fast enough to protect the transistors in the power amplifier) and slower response to falling amplitude (to ensure a stable feedback loop). These characteristics may be obtained with a cascade of (i) peak detector 362 having fast response to both rising and falling amplitude and (ii) peak detector 364 having fast response to rising amplitude and slow response to falling amplitude. Peak detectors 362 and 364 may also be combined in a single circuit.

Referring back to FIG. 4, Vref2 through VrefM may be associated with different discrete gains for driver amplifier 342, and Vref1 and Vref2 may determine the amount of hysteresis. The desired Vref1 through VrefM may be obtained with (i) appropriate values for resistors 472a through 472m and (ii) an appropriate value for Vref with a given Iref current from current source 474. In an exemplary design, calibration may be performed to determine the appropriate Vref value. For calibration, the RFin signal may be set to a nominal signal level, and a nominal gain may be selected for driver amplifier 342. A worst-case VSWR (e.g., of 20:1 or 10:1) may be applied to power amplifier 344. Vref may then be adjusted so that the protection circuit kicks in and lowers the gain of driver amplifier 342. Vref may then be set to the voltage at which the protection circuit kicks in. The desired Vref1 through VrefM may be obtained with (i) the appropriate Vref determined from calibration and (ii) appropriate ratios of resistor values, which may be accurately obtained from design.

In an exemplary design, an apparatus (e.g., a wireless device, an integrated circuit, etc.) may include a PA module and a protection circuit, e.g., as shown in FIGS. 3 and 4. The PA module may receive an input RF (RFin) signal and provide an output RF (RFout) signal. The protection circuit may be coupled to the PA module and may control a transmitter gain to protect the PA module against high peak voltage of the RFout signal. The protection circuit may include a plurality of comparators, which may receive an analog input signal obtained based on the RFout signal, quantize the analog input signal, and provide a plurality of digital comparator output signals used to adjust the transmitter gain.

In an exemplary design, the PA module may include a driver amplifier coupled in series with a power amplifier, e.g., as shown in FIGS. 3 and 4. The transmitter gain may comprise a gain of the driver amplifier. The protection circuit may control the gain of the driver amplifier to protect the power amplifier against high peak voltage of the RFout signal. In another exemplary design, the PA module may include only the power amplifier. The protection circuit may control the gain of the power amplifier and/or some other gain in a transmit path.

In an exemplary design, the protection circuit may further include a peak detector. The peak detector may receive a peak detector input signal (e.g., Vin) obtained based on the RFout signal, detect for peak voltage of the RFout signal based on the peak detector input signal, and provide the analog input signal (e.g., Vpeak) to the plurality of comparators. In an exemplary design, the analog input signal may track rising amplitude of the RFout signal but may lag falling amplitude of the RFout signal.

In an exemplary design, each of the plurality of comparators may receive the analog input signal at a first input, receive one of a plurality of reference voltages (e.g., Vref1 through VrefM) at a second input, and provide one of the plurality of comparator output signals (e.g., B1 through BM signals), e.g., as shown in FIG. 4. The number of comparators to use may be dependent on the number of discrete gain values for the transmitter gain.

In an exemplary design, the protection circuit may further include an anti-toggling control circuit to generate at least one control signal with hysteresis based on the comparator output signals. The comparator output signals may include at least one comparator output signal (e.g., B2 through BM signals) and a designated comparator output signal (e.g., B1 signal). The at least one control signal (e.g., C2 through CM signals) may have leading edges determined by the at least one comparator output signal and falling edges determined by the designated comparator output signal.

In an exemplary design, the protection circuit may further include a thermal-to-binary encoder to generate at least one gain control signal (e.g., D2 through DM signals) based on (i) the at least one control signal from the anti-toggling control circuit or (ii) the comparator output signals from the comparators. The at least one gain control signal may be associated with at least one discrete gain value for the transmitter gain. At most one gain control signal may be asserted at any given moment to select at most one discrete gain value for the transmitter gain.

In another exemplary design, an apparatus may include a PA module and a protection circuit. The PA module may receive an RFin signal and provide an RFout signal. The protection circuit may control a transmitter gain to protect the PA module against high peak voltage of the RFout signal. The protection circuit may reduce the transmitter gain when the amplitude of the RFout signal exceeds a high threshold and may increase the transmitter gain when the amplitude of the RFout signal falls below a low threshold. The low threshold may be below the high threshold to provide hysteresis.

In an exemplary design, the protection circuit may reduce the transmitter gain from a first gain value (e.g., G1) to a second gain value (e.g., G2) when the amplitude of the RFout signal exceeds the high threshold. The protection circuit may further reduce the transmitter gain to a third gain value (e.g., G3) when the amplitude of the RFout signal exceeds a higher threshold. The higher threshold may be above the high threshold. The protection circuit may increase the transmitter gain from the second gain value or the third gain value to the first gain value when the amplitude of the RFout signal falls below the low threshold.

In an exemplary design, the protection circuit may include a plurality of comparators and an anti-toggling control circuit. The comparators may receive an analog input signal obtained based on the RFout signal, quantize the analog input signal based on a plurality of reference voltages (e.g., Vref1 through VrefM), and provide a plurality of comparator output signals. The plurality of reference voltages may correspond to a plurality of thresholds, which may include the high, higher and low thresholds mentioned above. The control circuit may generate at least one control signal with hysteresis based on the comparator output signals. The comparator output signals may include at least one comparator output signal and a designated comparator output signal, which may be generated based on the low threshold. The at least one control signal may have leading edges determined by the at least one comparator output signal and falling edges determined by the designated comparator output signal. The at least one control signal may be used to adjust the transmitter gain.

In an exemplary design, the RFout signal may be amplitude modulated and may have a time-varying envelope. In another exemplary design, the RF signal may have a constant amplitude. In either case, the hysteresis may avoid toggling of the transmitter gain between two gain values due to load mismatch at the output of the PA module.

In yet another exemplary design, an apparatus may include a PA module and a protection circuit. The PA module may receive an RFin signal and provide an RFout signal. The protection circuit may control a transmitter gain to protect the PA module against high peak voltage of the RFout signal. The protection circuit may have faster response to rising amplitude than falling amplitude of the RFout signal.

In an exemplary design, the protection circuit may include a peak detector to detect for peak voltage of the RFout signal. The peak detector may receive an input signal obtained based on the RFout signal, detect for peak voltage of the RFout signal based on the input signal, and provide an output signal tracking the rising amplitude of the RFout signal and lagging the falling amplitude of the RFout signal. In an exemplary design, the peak detector may include first and second peak detectors, e.g., as shown in FIG. 3. The first peak detector may receive the input signal and provide an intermediate signal tracking the rising and falling amplitude of the RFout signal. The second peak detector may be coupled to the first peak detector and may receive the intermediate signal and provide the output signal. The second peak detector may have (i) a charging current for detecting the rising amplitude of the RFout signal and (ii) a discharging current for detecting the falling amplitude of the RFout signal. The discharging current may be at least one order of magnitude smaller than the charging current to obtain slower response for falling amplitude of the RFout signal.

In an exemplary design, the RFout signal may be amplitude modulated. The protection circuit may track the rising amplitude of the RFout signal due to amplitude modulation and may lag the falling amplitude of the RFout signal due to amplitude modulation. In another exemplary design, the RFout signal may have a constant amplitude. For both exemplary designs, the protection circuit may track the rising amplitude of the RFout signal due to load mismatch.

Figure 10:
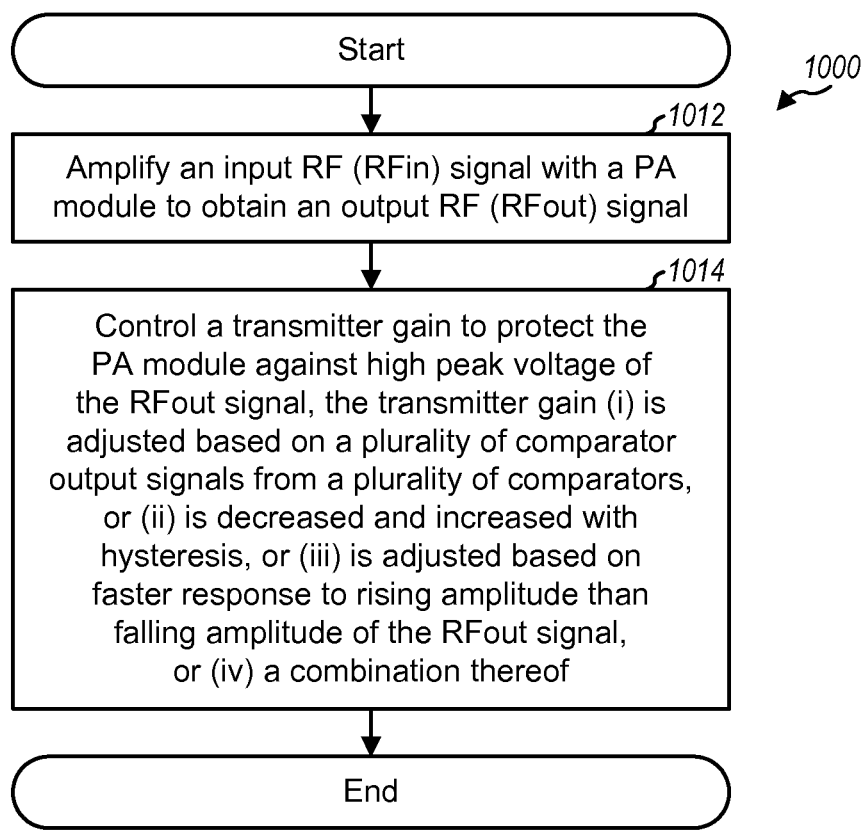
FIG. 10 shows a process for protecting a power amplifier from high peak voltage.

FIG. 10 shows an exemplary design of a process for protecting a PA module. An

RFin signal may be amplified with the PA module to obtain an RFout signal (block 912). A transmitter gain may be controlled to protect the PA module against high peak voltage of the RFout signal (block 914). The transmitter gain may be (i) adjusted based on a plurality of comparator output signals from a plurality of comparators, or (ii) decreased and increased with hysteresis, or (iii) adjusted based on faster response to rising amplitude than falling amplitude of the RFout signal, or (iv) a combination thereof.

In an exemplary design, peak voltage of the RFout signal may be detected, and a peak detector output signal tracking the rising amplitude of the RFout signal and lagging the falling amplitude of the RFout signal may be provided. In an exemplary design, the peak detection may be performed in two steps. For the first step, the peak voltage of the RFout signal may be detected with a first peak detector to obtain an intermediate signal that tracks the rising and falling amplitude of the RFout signal. In the second step, peak voltage of the intermediate signal may be detected with a second peak detector to obtain the peak detector output signal that tracks the rising amplitude and lags the falling amplitude of the RFout signal. Peak detection may also be performed in other manners.

In an exemplary design, the transmitter gain may be reduced when the amplitude of the RFout signal exceeds a high threshold. The transmitter gain may be increased when the amplitude of the RFout signal falls below a low threshold. The low threshold may be below the high threshold to provide hysteresis.

In an exemplary design, at least one control signal used to adjust the transmitter gain may be generated based on the plurality of comparator output signals. The comparator output signals may include at least one comparator output signal and a designated comparator output signal. The at least one control signal may have leading edges determined by the at least one comparator output signal and falling edges determined by the designated comparator output signal.

The PA module and protection circuit described herein may be implemented on an IC, an analog IC, an RFIC, a mixed-signal IC, an ASIC, a printed circuit board (PCB), an electronic device, etc. The PA module and protection circuit may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the PA module and protection circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC, (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a power amplifier (PA) module to receive an input radio frequency (RFin) signal and provide an output RF (RFout) signal; and
a protection circuit coupled to the PA module and to control a transmitter gain to protect the PA module against high peak voltage of the RFout signal, the protection circuit comprises a plurality of comparators to receive an analog input signal obtained based on the RFout signal, to quantize the analog input signal, and to provide a plurality of digital comparator output signals used to adjust the transmitter gain, the protection circuit further comprises a control circuit to generate at least one control signal with hysteresis based on the plurality of comparator output signals, the at least one control signal is used to adjust the transmitter gain and the protection circuit has faster response to rising amplitude than falling amplitude of the RFout signal based on combinations of a plurality of comparator output signals resulting from a plurality of reference signals compared to the RFout signal.

2. The apparatus of claim 1, each of the plurality of comparators receives the analog input signal at a first input, receives one of a plurality of reference voltages at a second input, and provides one of the plurality of comparator output signals.

3. The apparatus of claim 1, the plurality of comparator output signals comprise at least one comparator output signal and a designated comparator output signal, the at least one control signal has leading edges determined by the at least one comparator output signal and falling edges determined by the designated comparator output signal.

4. The apparatus of claim 1, the protection circuit further comprises
a thermal-to-binary encoder to generate at least one gain control signal, used to adjust the transmitter gain, based on the plurality of comparator output signals.

5. The apparatus of claim 4, the at least one gain control signal is associated with at least one discrete gain value for the transmitter gain, and at most one of the at least one gain control signal is asserted to select at most one of the at least one discrete gain value.

6. The apparatus of claim 1, the protection circuit further comprises
a peak detector to receive a peak detector input signal obtained based on the RFout signal, to detect for peak voltage of the RFout signal based on the peak detector input signal, and to provide the analog input signal to the plurality of comparators.

7. The apparatus of claim 6, the analog input signal tracks rising amplitude of the RFout signal and lags falling amplitude of the RFout signal.

8. The apparatus of claim 1, the PA module comprises a driver amplifier coupled in series with a power amplifier, the transmitter gain comprises a gain of the driver amplifier, and the protection circuit controls the gain of the driver amplifier to protect the power amplifier against high peak voltage of the RFout signal.

9. An apparatus comprising:
a power amplifier (PA) module to receive an input radio frequency (RFin) signal and provide an output RF (RFout) signal; and
a protection circuit coupled to the PA module and to control a transmitter gain to protect the PA module against high peak voltage of the RFout signal, the protection circuit configured to reduce the transmitter gain when amplitude of the RFout signal exceeds a high threshold and increase the transmitter gain when the amplitude of the RFout signal falls below a low threshold, the low threshold is below the high threshold to provide hysteresis and the protection circuit has faster response to rising amplitude than falling amplitude of the RFout signal based on combinations of a plurality of comparator output signals resulting from a plurality of reference signals compared to the RFout signal.

10. The apparatus of claim 9, the protection circuit reduces the transmitter gain from a first gain value to a second gain value when the amplitude of the RFout signal exceeds the high threshold and further reduces the transmitter gain to a third gain value when the amplitude of the RFout signal exceeds a higher threshold, the higher threshold is above the high threshold.

11. The apparatus of claim 10, the protection circuit increases the transmitter gain from the second gain value or the third gain value to the first gain value when the amplitude of the RFout signal falls below the low threshold.

12. The apparatus of claim 9, the protection circuit comprises
a peak detector to detect for peak voltage of the RFout signal and to provide an output signal tracking rising amplitude of the RFout signal and lagging falling amplitude of the RFout signal, and the transmitter gain is increased or decreased based on the output signal from the peak detector.

13. The apparatus of claim 9, the protection circuit comprises
a plurality of comparators to receive an analog input signal obtained based on the RFout signal, to quantize the analog input signal based on a plurality of reference voltages, and to provide a plurality of comparator output signals, the plurality of reference voltages correspond to a plurality of thresholds including the high and low thresholds, and
a control circuit to generate at least one control signal with hysteresis based on the plurality of comparator output signals, the at least one control signal is used to adjust the transmitter gain.

14. The apparatus of claim 13, the plurality of comparator output signals comprise at least one comparator output signal and a designated comparator output signal generated based on the low threshold, the at least one control signal has leading edges determined by the at least one comparator output signal and falling edges determined by the designated comparator output signal.

15. The apparatus of claim 9, the RFout signal is amplitude modulated and has a time-varying envelope.

16. The apparatus of claim 9, the hysteresis avoids toggling of the transmitter gain between two gain values due to load mismatch at an output of the PA module.

17. An apparatus comprising:
a power amplifier (PA) module to receive an input radio frequency (RFin) signal and provide an output RF (RFout) signal; and
a protection circuit coupled to the PA module and to control a transmitter gain to protect the PA module against high peak voltage of the RFout signal, the protection circuit has faster response to rising amplitude than falling amplitude of the RFout signal based on combinations of a plurality of comparator output signals resulting from a plurality of reference signals compared to the RFout signal.

18. The apparatus of claim 17, the protection circuit comprises
a peak detector to receive an input signal obtained based on the RFout signal, to detect for peak voltage of the RFout signal based on the input signal, and to provide an output signal tracking the rising amplitude of the RFout signal and lagging the falling amplitude of the RFout signal.

19. The apparatus of claim 18, the peak detector comprises
a first peak detector to receive the input signal and provide an intermediate signal tracking the rising and falling amplitude of the RFout signal, and
a second peak detector coupled to the first peak detector and to receive the intermediate signal and provide the output signal.

20. The apparatus of claim 19, the second peak detector has a charging current for detecting the rising amplitude of the RFout signal and a discharging current for detecting the falling amplitude of the RFout signal, the discharging current is at least one order of magnitude smaller than the charging current.

21. The apparatus of claim 17, the RFout signal is amplitude modulated, and the protection circuit tracks the rising amplitude of the RFout signal due to amplitude modulation and lags the falling amplitude of the RFout signal due to amplitude modulation.

22. A method of protecting a power amplifier (PA) module, comprising:
amplifying an input radio frequency (RFin) signal with the PA module to obtain an output RF (RFout) signal; and
controlling a transmitter gain to protect the PA module against high peak voltage of the RFout signal, the transmitter gain is decreased and increased with hysteresis, and is adjusted based on faster response to rising amplitude than falling amplitude of the RFout signal based on combinations of a plurality of comparator output signals resulting from a plurality of reference signals compared to the RFout signal.

23. The method of claim 22, the controlling the transmitter gain comprises detecting for peak voltage of the RFout signal and providing a peak detector output signal tracking the rising amplitude of the RFout signal and lagging the falling amplitude of the RFout signal.

24. The method of claim 23, the detecting for peak voltage of the RFout signal comprises detecting for the peak voltage of the RFout signal with a first peak detector to obtain an intermediate signal tracking the rising and falling amplitude of the RFout signal, and detecting for peak voltage of the intermediate signal with a second peak detector to obtain the peak detector output signal.

25. The method of claim 22, the controlling the transmitter gain comprises reducing the transmitter gain when the amplitude of the RFout signal exceeds a high threshold, and increasing the transmitter gain when the amplitude of the RFout signal falls below a low threshold, the low threshold is below the high threshold to provide hysteresis.

26. The method of claim 22, the controlling the transmitter gain comprises generating at least one control signal, used to adjust the transmitter gain, based on the plurality of comparator output signals, the plurality of comparator output signals comprise at least one comparator output signal and a designated comparator output signal, the at least one control signal has leading edges determined by the at least one comparator output signal and falling edges determined by the designated comparator output signal.

27. An apparatus comprising:

means for amplifying an input radio frequency (RFin) signal to obtain an output RF (RFout) signal; and means for controlling a transmitter gain to protect the means for amplifying against high peak voltage of the RFout signal, the transmitter gain is decreased and increased with hysteresis and is adjusted based on faster response to rising amplitude than falling amplitude of the RFout signal based on combinations of a plurality of comparator output signals resulting from a plurality of reference signals compared to the RFout signal.

* * * * *